United States Patent [19]

Godfrey

[11] 3,737,346

[45] June 5, 1973

[54] SEMICONDUCTOR DEVICE FABRICATION USING COMBINATION OF ENERGY BEAMS FOR MASKING AND IMPURITY DOPING

[75] Inventor: James Godfrey, Allentown, Pa.

[73] Assignee: Bell Telephone Laboratories, Incorporated, Murray Hill, N.J.

[22] Filed: July 1, 1971

[21] Appl. No.: 158,789

[52] U.S. Cl. ...................148/1.5, 148/187, 148/189, 29/578, 29/584, 117/93.3

[51] Int. Cl. ...............................................H01l 7/54

[58] Field of Search.......................148/1.5, 187, 189; 317/235–248.9; 29/578, 584; 117/93.3; 156/17

[56] References Cited

UNITED STATES PATENTS

| | | | |
|---|---|---|---|
| 3,563,809 | 2/1971 | Wilson | 148/1.5 |
| 3,655,457 | 4/1972 | Duffy et al. | 148/1.5 |
| 3,615,875 | 10/1971 | Morita et al. | 148/1.5 |
| 3,193,418 | 7/1965 | Cooper et al. | 148/189 X |
| 3,364,087 | 1/1968 | Solomon et al. | 117/37 R |
| 3,571,918 | 3/1971 | Haberecht | 317/235 |

*Primary Examiner*—G. T. Ozaki
*Attorney*—R. J. Guenther and Edwin B. Cave

[57] ABSTRACT

A thin film of a readily volatizable metal, such as cadmium, is formed on the surface of a semiconductor slice. A programmed electron beam forms a masking pattern by volatizing portions of the metal film, for example, defining the emitter windows for a transistor. Without breaking the vacuum ambient an ion implantation introduces the first impurity through the openings in the mask. The electron beam then defines a second mask pattern, enlarging the first openings to define, for example, the base windows, and forming separate new openings, as for diodes and resistors. A second ion implantation puts in a second impurity, again without impairing the original vacuum. These steps are followed by conventional heat treatment for annealing or drive-in of impurities and the device fabrication is completed using conventional metallization techniques and wafer separation.

4 Claims, 1 Drawing Figure

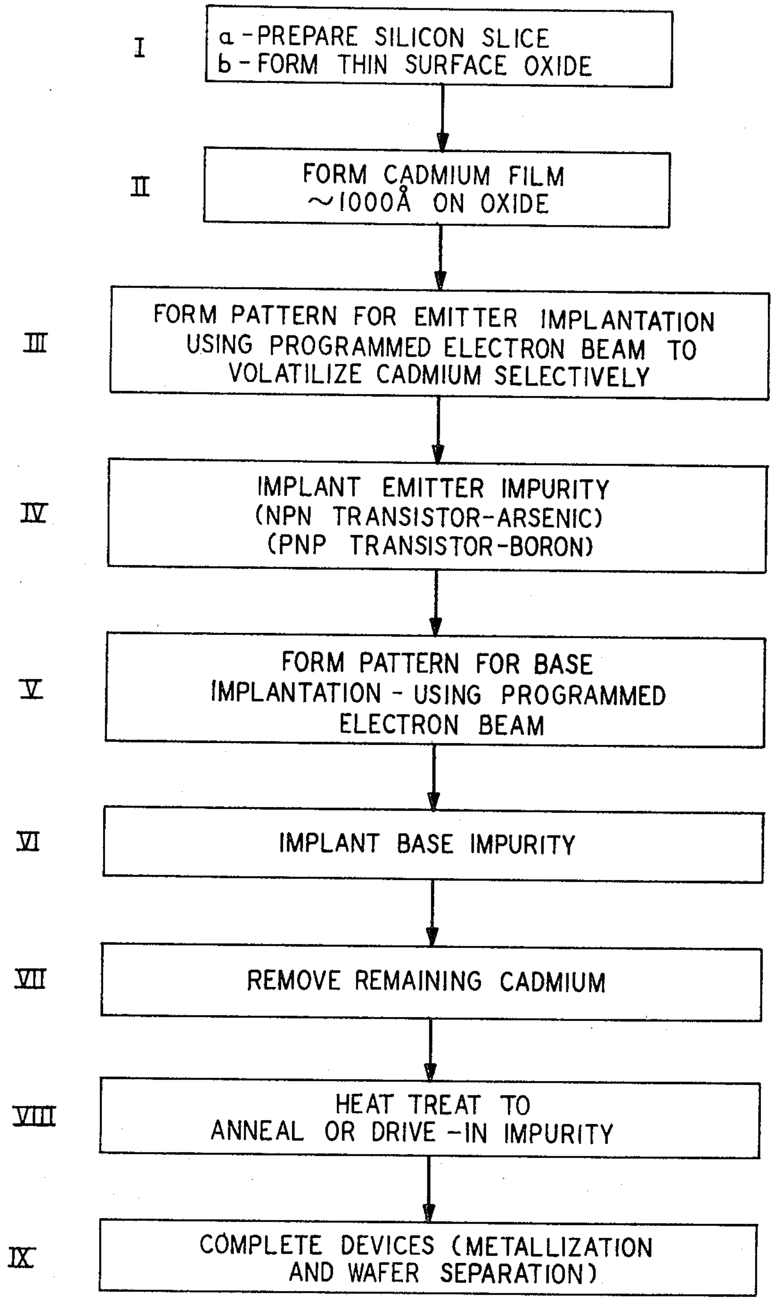
INVENTOR
J. GODFREY
BY H.W. Lockhart
ATTORNEY

SEMICONDUCTOR DEVICE FABRICATION USING COMBINATION OF ENERGY BEAMS FOR MASKING AND IMPURITY DOPING

This relates to semiconductor device fabrication and, more particularly, to a method using energy beams to generate a metal mask and to introduce significant impurities through the mask by ion implantation.

BACKGROUND OF THE INVENTION

Ion implantation is currently gaining a significant place as a technique for the fabrication of semiconductor devices. It is a powerful tool for the controlled introduction of significant impurities into semiconductor bodies. Although a variety of materials are used as masking agents for various ion implantation techniques, including, in particular, silicon dioxide, which has been the conventional diffusion mask, there is still a need for masks having higher stopping power coupled with convenience of pattern generation.

It is, therefore, an object of this invention to enable convenient generation of a metal mask particularly suitable for ion implantation which can be performed in a vacuum and directly followed by the ion implantation step in the same vacuum ambient.

SUMMARY OF THE INVENTION

In accordance with the invention a thin film of a volatizable metal, such as cadmium or bismuth, is formed on the surface of a slice of semiconductor material. The thus coated slice then is subjected to the impingement of a programmed electron beam which forms the initial mask pattern by volatizing those portions of the metal film upon which the beam falls.

Without breaking the vacuum ambient in which the pattern generation step is carried out, a first significant impurity is introduced through the mask by ion implantation. Typically, for making a transistor, the introduction of this first impurity forms the emitter zone. Following this step the electron beam shaping process is utilized again to enlarge the intial openings or to form a second series of new openings. Then a second significant impurity is introduced through the new mask by a second ion implantation step. Typically, the second impurity introduced through enlarged windows makes the base zones of transistors, or, where a new series of openings had been formed, makes single PN junctions for diodes.

Advantageously, the series of steps involving the use of energy beams, both for mask generation and impurity introduction, occur in a vacuum ambient which is not broken during the entire process.

Finally, the slice is removed and subjected to conventional heat treatment for annealing or drive-in of impurities. The remaining processing involves conventional metallization and wafer separation processes.

BRIEF DESCRIPTION OF THE DRAWING

The other objects and features of the invention may be better understood from the following detailed description taken in conjunction with the Drawing, which is a block diagram illustrating the successive steps in the process in accordance with this invention.

DETAILED DESCRIPTION

As indicated by Block I of the drawing, the process starts with the preparation of a conventional slice of semiconductor material, specifically silicon, taken from a monocrystalline ingot and being typically of several inches in diameter and of 10 to 30 mils in thickness. As is known in the art, such a slice may comprise a substrate portion of one conductivity silicon and surface film portion of a different conductivity silicon formed epitaxially by vapor deposition. Such thin epitaxially formed regions typically have thicknesses of the order of microns. It is advantageous to form on the surface of this epitaxial portion of the slice a thin film of silicon oxide, typically by a thermal treatment in a suitable oxidizing atmosphere. Such a surface oxide film may be a few hundred A in thickness and is primarily for the purpose of improving the adhesion of the subsequently deposited metal film.

Next, as indicated in Block II, a thin film of cadmium metal is formed on the oxide coated surface of the silicon slice. This step is carried out in a vacuum enclosure, typically by means of a metal evaporation technique using a suitable filament and material source. A suitable film is about 1,000 A thick.

Without removing the slice from the vacuum enclosure or breaking the vacuum, an initial pattern is formed in the cadmium film by inpinging thereon a programmed electron beam. Referring to Block III of the drawing, the programmed electron beam has sufficient energy and is focused to precise dimensions so as to volatilize particular portions of the cadmium film upon which the beam impinges. In the case of cadmium, its heat of sublimation is about 25 kilocalories per gram-atom. Thus, for a film which is 1,000 A thick, the energy for vaporization is approximately 0.1 joules/cm$^2$. Using a beam of 15 keV electrons, this energy level requires a beam current of about 7 micron-coulombs per square centimeter. As an alternative to cadmium, bismuth is also a metal having comparable characteristics to those set forth above for cadmium. Both metals are applied conventionally by evaporation, or alternatively by sputtering, and both have a suitably low vapor pressure at room temperature. Steps should be taken within the vacuum enclosure to insure that the vaporized metal deposits away from the electron optical system and the work piece itself.

After the initial pattern has been generated in the cadmium film to produce the initial ion implantation mask, the ion implantation is performed as indicated in Block IV of the drawing. As previously pointed out, this step is accomplished in the same vacuum enclosure as the pattern generation step and constitutes the introduction of a first significant impurity to form conductivity type zones as desired in the silicon body. Typically, for the fabrication of transistors, if of the NPN type, the first impurity might be arsenic, or if PNP type, the first impurity might be boron. Other similar donor and acceptor impurities likewise may be used.

Following the intial ion implantation step, if further conductivity type region formation is desired, the process continues as indicated in Block V by a second electron beam impingement. This application of a programmed electron beam may serve to enlarge the openings produced initially so as, for example, to define the base zone implantation, or in the case of integrated devices which include diode or other single junction elements, a series of new windows may be generated in the metal film.

Then, as set forth in Block VI of the Drawing, a second significant impurity is introduced by ion implantation. This impurity implantation occurs through and around the initially formed emitters or provides a single PN junction in the case of newly formed openings.

As set forth in Block VII, the slice then may be removed from the vacuum enclosure and treated to remove the remaining metal film on the silicon slice. Then, referring to Block VIII, suitable heat treatments may be employed to anneal the slice, removing damage or distortions, or to provide a further drive-in of significant impurities within the semiconductor slice. Such techniques are well known in the art. Similarly, as indicated in Block IX, the slice may be further processed using metallization techniques to form interconnection patterns and contact electrodes and, finally, the slice may be separated into individual wafers comprising usable semiconductor devices.

Although the invention has been disclosed in terms of a particular sequence of fabrication steps, it will be obvious to those skilled in the art that the particular sequence of generating an ion implantation mask using an energy beam followed by the ion implantation of a significant impurity itself in a common ambient constitutes a most useful tool suitable for the fabrication of a variety of semiconductor devices. The provision of the particular metals, cadmium and bismuth, having the critically desirable characteristics as set forth above which enable them to be used for mask formation likewise is an important feature of the invention.

What is claimed is:

1. The method of fabricating a semiconductor device including the steps of forming a metal mask on a surface of a silicon semiconductor body by depositing a thin film of a volatizable metal selected from the group consisting of cadmium and bismuth, impinging on said thin metal film an electron beam in accordance with a desired mask pattern to remove selected portions of said metal film, then subjecting said masked surface of said silicon semiconductor body to an ion beam composed of a significant impurity to alter the conductivity of underlying portions of said silicon semiconductor body as determined by said metal mask.

2. The method in accordance with claim 1 which includes the step of forming on the surface of the silicon semiconductor body a layer of silicon oxide prior to forming the metal film for improving the adherence thereof.

3. The method of fabricating a semiconductor device including the steps of forming a metal mask on a surface of a silicon semiconductor body by depositing a thin film of a volatizable metal selected from the group consisting of cadmium and bismuth, impinging on said thin metal film an electron beam in accordance with a desired mask pattern to remove selected portions of said metal film, then subjecting said masked surface of said silicon semiconductor body to an ion beam composed of a significant impurity to alter the conductivity of underlying portions of said silicon semiconductor body as determined by said metal mask, impinging a beam of electrons in accordance with another pattern to selectively remove other portions of said thin metal film, thereby forming a second series of openings in said thin metal film, subjecting said masked surface to an ion beam of another significant impurity to alter the conductivity of underlying portions of said body as determined by said metal mask.

4. The method in accordance with claim 3 in which at least one of said second series of openings is an enlargement of one of said first openings in said metal film.

* * * * *